United States Patent [19]

Knoop

[11] Patent Number: 5,733,137
[45] Date of Patent: Mar. 31, 1998

[54] APPARATUS FOR PUSHING A PLUG-IN ASSEMBLY INTO A MOUNTING RACK

[75] Inventor: Franz-Josef Knoop, Büren, Germany

[73] Assignee: Siemens Nixdorf Informationssysteme Aktiengesellschaft, Paderborn, Germany

[21] Appl. No.: 793,360

[22] PCT Filed: Feb. 8, 1995

[86] PCT No.: PCT/DE95/01008

§ 371 Date: Feb. 24, 1997

§ 102(e) Date: Feb. 24, 1997

[87] PCT Pub. No.: WO96/07303

PCT Pub. Date: Mar. 7, 1996

[30] Foreign Application Priority Data

Aug. 31, 1994 [DE] Germany ............... 9414105 U

[51] Int. Cl.⁶ ............................................. H01R 13/627
[52] U.S. Cl. ............. 439/362; 439/256; 411/433; 411/386; 403/342; 403/343; 29/432.2
[58] Field of Search ............... 439/364, 362, 439/253, 256; 411/386, 433, 366, 412; 403/342, 343; 29/437, 432.2

[56] References Cited

U.S. PATENT DOCUMENTS

| | | | |
|---|---|---|---|
| 2,855,454 | 10/1958 | Alden | 439/345 |
| 4,318,157 | 3/1982 | Rank et al. | 439/362 |
| 4,679,457 | 7/1987 | Nishikawa et al. | 411/433 |

FOREIGN PATENT DOCUMENTS

| | | |
|---|---|---|
| 0 304 772 A1 | 8/1988 | European Pat. Off. . |
| 0 398 030 A2 | 4/1990 | European Pat. Off. . |
| 33 23 029 C2 | 6/1983 | Germany . |
| 930016713 | 6/1993 | Japan . |

Primary Examiner—Gary F. Paumen
Assistant Examiner—Tho Dac Ta
Attorney, Agent, or Firm—Hill, Steadman & Simpson

[57] ABSTRACT

A threaded rod is fitted to a plug-in assembly which can be inserted into a mounting rack, which threaded rod is aligned in the insertion direction and becomes operatively connected to a motor-driven threaded nut during insertion. The first thread pitches are designed such that the rod and nut latch on one another.

21 Claims, 1 Drawing Sheet

APPARATUS FOR PUSHING A PLUG-IN ASSEMBLY INTO A MOUNTING RACK

BACKGROUND OF THE INVENTION

1. Field of the Invention

The present invention relates generally to electronic systems which include mounting racks and plug-in assemblies for insertion and removal from said mounting racks. More specifically, the present invention relates to an apparatus and a method for inserting plug-in assemblies into mounting racks and for removal of plug-in assemblies from mounting racks.

2. Description of the Prior Art

In the case of electronic systems, particularly for data and information technology, it must be possible to replace or to add individual electronic assemblies which, in general, are designed as plug-in assemblies which are held in a mounting rack. For this purpose, it is necessary to end ongoing programs correctly and to protect the data. A new system start re-boot is then required after switching on. This results in long delays in which the system is not available although the actual replacement or retrofitting of a plug-in assembly lasts only a few moments.

The object of the invention is thus to provide an apparatus of the type mentioned initially, by means of which replacement or the addition of a plug-in assembly is possible without having to switch the electronic system off and consequently without having to re-start or re-boot the electronic system.

The object is achieved by the characterizing features of claim 1.

An apparatus of the type mentioned has already been disclosed in U.S. Pat. No. 2,855,454. In this document, one threaded element on a push-in unit is designed as a sleeve having a groove which is introduced in its circumference, is open at its end pointing in the direction of the other threaded element, starts with its axis parallel to the sleeve and then merges into a region which is wound around the sleeve. The other threaded element is formed by a hole in a housing back plane, into which a pin projects radially. The sleeve can be rotated about its longitudinal axis by means of a handle.

In order to insert the plug-in assembly into the mounting rack, the groove must first of all be moved such that it is aligned with the pin. The plug-in assembly can then be pushed in further until the pin reaches the wound region of the groove. It is not possible to push the plug-in assembly into the mounting rack by manual rotation of the sleeve until this situation is reached.

SUMMARY OF THE INVENTION

The invention is based on the idea that an unpredictable time is required for the previously normal replacement or insertion of plug-in assemblies by hand. If these operations were carried out with the system running, then the configuration of the system would be changed for an indeterminate time, and access by the system computer to a plug-in assembly which has just been withdrawn would lead to operating system running errors.

The present invention includes an apparatus for attaching a front edge of a plug-in assembly to a front insertion side of a mounting rack. The apparatus comprises a combination of a male threaded element and a female threaded element. One of the threaded elements is associated with a mounting rack and one of the threaded elements is associated with the plug-in assembly. Further, one of the threaded elements, preferably the threaded element associated with the mounting rack, is connected to a motor which, when activated, rotates the threaded element. The female threaded element threadably receives the male threaded element without the need for any rotation of either element. In this way, the threads are "started" or the two elements are threadably engaged merely upon the insertion of the male threaded element into the female threaded element.

More specifically, the female threaded element comprises a threaded nut having a front opening or front end that further comprises a threaded elastic sleeve for threadably receiving the male threaded element without rotation of either the female threaded element or the male threaded element. The threaded elastic sleeve is sufficiently resilient so as to permit the threads disposed on the front end of the threaded male element to move past one or more threads disposed on the resilient sleeve of the female threaded element. As a result, the male threaded element becomes threadably engaged with the elastic sleeve of the female threaded element without rotation of either element. As a result, the threaded engagement of the male and female element gets "started" without any rotation of either element. In this way, the male element may be disposed on either the plug-in assembly or the mounting rack and the female element may be disposed on either the plug-in assembly or the mounting rack.

To complete the threaded engagement between the male and female elements, a motor is connected to one of said elements which, when activated, rotates one of said elements to complete the threaded engagement and draw the front edge of the plug-in assembly, with at least one male connector strip mounted thereon into the female connector strip mounted onto the front side of the mounting rack.

To remove the plug-in assembly from the mounting rack, the motor is simply reversed which results in a disengagement of the male and female threaded elements which, in turn, results in a withdrawing of the male connector strip mounted onto the front edge of the plug-in assembly from the female connector strip mounted onto the front edge of the mounting rack.

In an embodiment, the front end of the female threaded element comprises at least one threaded spring arm that is biased inwardly towards the thread axis for threadably engaging the male threaded element without rotation of either the male or female threaded element.

In an embodiment, the female threaded element comprises four inwardly biased and concentric spring arms for engaging the front end of the male threaded element without rotation of either the male threaded element or the female threaded element.

In an embodiment, the female threaded element is accommodated in an aperture disposed in the mounting rack and is further connected to a reversible motor.

In an embodiment, the male threaded element is mounted onto the front edge of the plug-in assembly.

In an embodiment, the female threaded element is attached to the front edge of the plug-in assembly.

In an embodiment, the male threaded element is disposed within an aperture disposed on the mounting rack and the male threaded element is further connected to a reversible motor.

In an embodiment, the male threaded element includes two different thread pitches, a flattened thread pitch being disposed adjacent to the front end of the male threaded element and a second rearwardly disposed thread pitch disposed adjacent to the rear end of the male threaded element. The rearwardly disposed thread pitch has a sharp profile with a full thread depth for securely threadably engaging the female threaded element and for securing the plug-in assembly to the mounting rack.

In an embodiment, the present invention provides a method for attaching a front edge of a plug-in assembly to a mounting rack, the method comprises the steps of inserting a male threaded element attached to a front edge of a plug-in assembly into a female threaded element attached to the front side of a mounting rack. The female threaded element comprises a threaded elastic sleeve for threadably receiving the male threaded element without rotation of either the male or female threaded elements. The female threaded element further being connected to a motor for rotation of the female threaded element. The second step of the method of the present invention comprising the activating of the motor to rotate the female threaded element to further draw the male threaded element into the female threaded element and simultaneously drawing at least one male connector strip mounted onto the front edge of the plug-in assembly to a female connector strip mounted onto the front side of the mounting rack.

In an embodiment, a method of attaching a front edge of a plug-in assembly to a front insertion side of a mounting rack in accordance with the present invention comprises the steps of inserting a female threaded element attached to the front edge of a plug-in assembly onto a male threaded element. The male threaded element being attached to the front side of the mounting rack. The male threaded element further being connected to a motor for rotation thereof. The female threaded element comprising a threaded elastic sleeve for threadably receiving the male threaded element without rotation of either the male or female threaded elements. The second step of the method comprising the step of activating the motor to rotate the male threaded element to draw the female threaded element onto the male threaded element and simultaneously drawing at least one male connector strip mounted onto the front edge of the plug-in assembly into a female connector strip mounted onto the front side of the mounting rack.

The apparatus according to the invention makes it possible to replace plug-in assemblies within a predetermined time interval, in that the assembly to be plugged in is inserted into the mounting rack to such an extent that the threaded rod is in the position immediately before engagement in the threaded nut. In this case, the electrical plug connection has not yet been produced between the assembly and the mounting rack. If the motor is now powered in the insertion direction, the plug-in assembly is pushed into the mounting rack by the interaction of the threaded elements, in a time which is independent of the human activity.

In order to design the coupling between the threaded elements, and thus the transport connection, particularly reliably, the thread of at least one threaded element is designed such that the threads of both engage in one another over at least one thread pitch, without having to operate the motor. This is done by pushing the plug-in assembly into the mounting rack. At the same time, the threaded elements are pressed together and latch on one another. The motor can now be operated without there being any sliding between the two threaded elements, or tilted insertion occurring.

In order to replace plug-in assemblies, the plug-in assembly to be pushed in is pushed into a spare insert location in the mounting rack, as described above. First of all, the motor which is assigned to the assembly to be pushed out is then driven in the extraction direction. As soon as the electrical connection to this assembly is interrupted, the motor of the spare location is powered in the insertion direction. The time period in which none of the assemblies is electrically connected to the mounting rack can thus be kept in the millisecond range.

In a development of the invention, the motors can be controlled by the system itself to which the mounting rack belongs. In consequence, the system computer—possibly controlled by an auxiliary program—can itself determine the time of the assembly change and can suppress the response of the relevant assemblies during this time.

BRIEF DESCRIPTION OF THE DRAWINGS

Further features and advantages of the invention can be found in the claims, the description and the drawing of an exemplary embodiment, in which:

DETAILED DESCRIPTION OF THE PRESENTLY PREFERRED EMBODIMENTS

Figure 1:
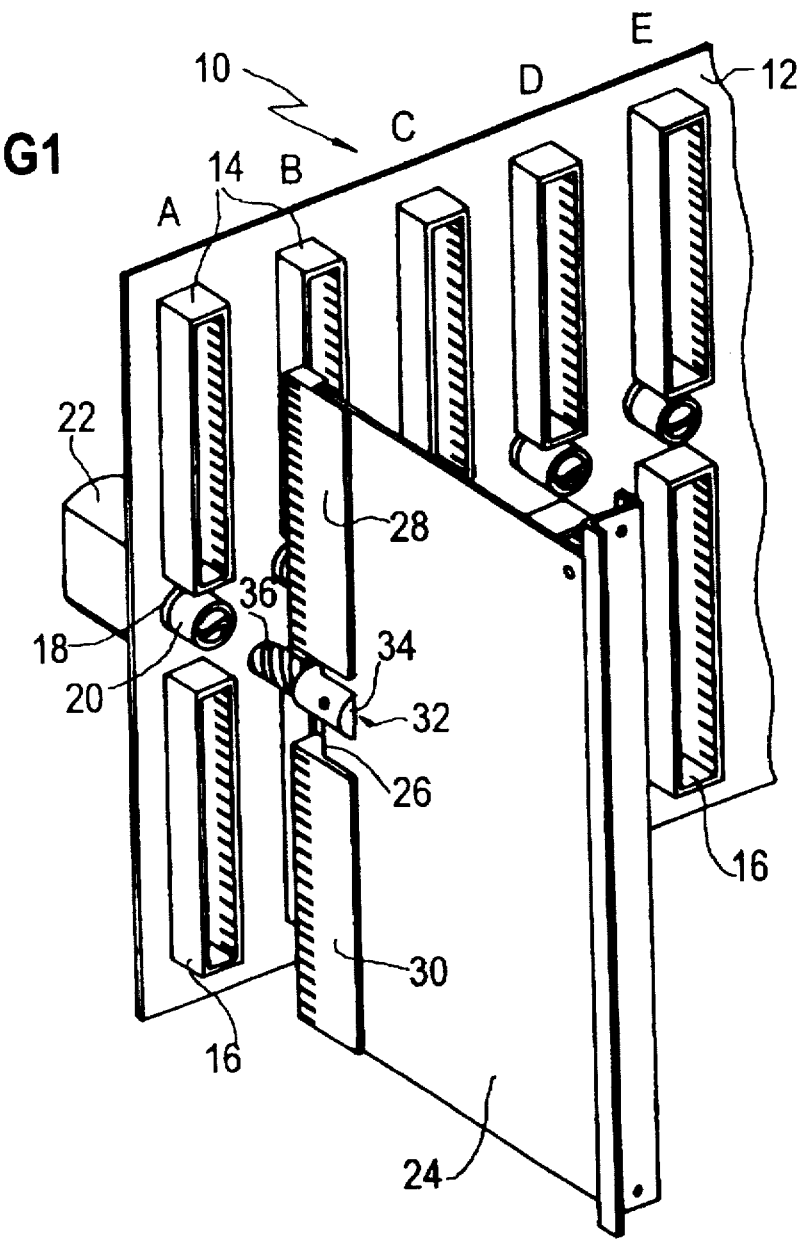
FIG. 1 shows parts of a mounting rack and a push-in assembly with the apparatus according to the invention, in a perspective illustration.

Only the back plane or panel 12 of a mounting rack 10 is illustrated in FIG. 1, from the insertion side. Illustration of the mounting rack housing and of the slide guides for the plug-in assemblies has been dispensed with, since they are generally known.

An upper and a lower female connector strip 14, 16 is in each case assigned to the individual plug-in locations A–E for plug-in assemblies. All the plug-in locations are identically constructed, and they are therefore described by way of example using the plug-in location A. Located between the female connector strips 14, 16 is an aperture 18 which extends from a rear side to a front insertion side of the panel or back plane 12, through which a threaded nut 20 projects, which is used as the first threaded element. This threaded nut 20 is connected in a rotationally fixed manner to the shaft of an electric motor 22, which is arranged on the rear side of the back plane 12.

A plug-in assembly 24 is illustrated opposite the plug-in location A, that is to say partially pushed into the mounting rack 10, and on whose front edge 26-seen in the insertion direction—male connector strips 28, 30 are mounted, which correspond to the female connector strips 14, 16. A second threaded element 32 is fitted on the front edge 26 of the plug-in assembly 24, between these male connector strips 28, 30. This second threaded element 32 comprises a rear end cylindrical part 34, which is flattened on one side for mounting on the plug-in assembly 24, and a threaded rod 36 which extends in the insertion direction of the plug-in assembly 24.

Figure 2:
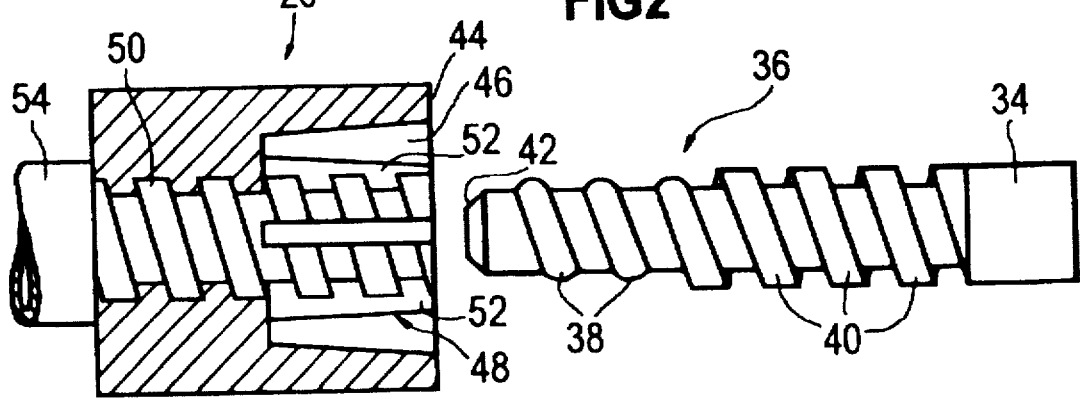
FIG. 2 shows a partially cut-away side view of the threaded elements.

FIG. 2 shows the threaded nut 20 and the threaded rod 36. The first two thread pitches 38 of the threaded rod 36 are flattened and have a round profile, while the remaining thread pitches 40 have a sharp profile and have the full thread depth. The front end or tip 42 is chamfered so that an insertion cone is produced which makes it easier to guide the rod 36 and the threaded nut 20 together in the correct position.

The threaded nut 20 has a cylindrical cross section. A coaxial groove 46 is incorporated in its front end 44, so that a concentric sleeve 48 is produced over part of its height. At least the sleeve 48 is composed of an elastic or resilient material. An internal thread 50 passes through the threaded nut 20, including the sleeve 48. The sleeve 48 is slotted in a crossed-over manner parallel to the thread axis, so that four spring arms 52 are produced, which are arranged concentrically around the thread axis. A different number of slots and thus of spring arms is, of course, also possible. The threaded nut 20 is connected to the shaft 54 of the motor 22 at its end opposite the end 44.

If it is intended to push a plug-in assembly 24 into the mounting rack 10, then this plug-in assembly 24 is pushed along the slide guides into the mounting rack 10 until the tip 42 of the threaded rod 36 is inserted the threaded nut 20. When it is pushed in further, the flattened thread pitches 38 initially press the spring arms 52 apart from one another, in order finally to latch on to their thread pitches. The latching process is also simplified in that the thread pitches of the threaded nut 20 are in a defined angular position with respect to the thread pitches of the threaded rod, as a result of monitored motor control. A predetermined latching-in position is thus always provided, in which the motor is stationary when the plug-in assembly 24 is pushed out. The male connector strips 28, 30 are not yet in contact with the female connector strips 14, 16 of the mounting rack in this position, so that no insertion forces have to be borne by the threaded elements 20, 36 yet. The spring force of the spring arms 52 is, however, adequate to hold the rod securely during operation of the motor 22 in the insertion direction. The plug-in assembly 24 is pulled in further by the motor until deep thread pitches 40 on the threaded rod 36 are engaged by the threaded nut. In consequence, the insertion forces of the female/male connector strip arrangement can also be transmitted via the threaded elements, without the latter becoming unlatched from one another. This is, on the one hand, a result of the fact that the deep thread pitches 40 have sharp profiles, as a result of which the moment of force forcing the spring arms 52 apart from one another is reduced. On the other hand, because of the greater thread depth of the deep thread pitches 40, the spring arms 52 would have to be deflected further in order to unlatch. At the same time, however, they strike against the outer wall of the groove 46, so that their maximum possible deflection movement is limited. The plug-in assembly 24 is now pushed in completely. The motor 22 can be switched off under time control or as a function of its torque—the latter increases sharply when the plug-in assembly 24 has reached its final position in the mounting rack 10. It is also possible to allow the motor to carry out only a number of revolutions corresponding to the number of thread pitches on the threaded rod 36.

In order to push a plug-in assembly out, the motor is powered in the extraction direction until the electrical contact between the male and female connector strips is interrupted. A run-on time of the motor 22 ensures reliable interruption of the electrical connection and that the threaded nut is stopped in the predetermined latching-in position.

It is, of course, also possible to fit the threaded nut to the plug-in assembly and the threaded rod to the motor, or to arrange the motor in the plug-in assembly.

Although modifications and changes may be suggested by those skilled in the art, it is the intention of the inventors to embody within the patent warranted hereon all changes and modifications as reasonably and properly come within the scope of their contribution of the art.

I claim:

1. An apparatus for attaching a front edge of a plug-in assembly to a front insertion side of a mounting rack, the mounting rack also having an opposing rear side, the apparatus comprising:

a male threaded element and a female threaded element, one of which is associated with the mounting rack, the other of which is associated with the plug-in assembly, one of the threaded elements being rotationally connected to a motor, the male and female threaded elements having a common thread axis, the female threaded element threadably receiving the male threaded element when the male threaded element is pressed into the female threaded element without rotation of either the male threaded element or the female threaded element.

wherein the male threaded element comprises a front end which extends towards the female threaded element and a rear end mounted to the plug-in assembly, at least one flattened thread pitch being disposed adjacent to the front end, the flattened thread pitch being threadably received by the female threaded element without rotation of either the male or female threaded elements upon insertion of the male threaded element into the female threaded element.

2. The apparatus of claim 1 wherein in the male threaded element comprises a threaded rod and the female threaded element comprises a threaded nut.

3. The apparatus of claim 1 wherein the female threaded element is rotationally connected to the motor.

4. The apparatus of claim 1 wherein the male threaded element is rotationally connected to the motor.

5. The apparatus of claim 1 wherein the female threaded element comprises front end comprising a threaded elastic sleeve for threadably receiving the male threaded element without rotation of either the female threaded element or the male threaded element.

6. The apparatus of claim 1 wherein the female threaded element comprises front end comprising at least one threaded spring arm that is biased inwardly towards the thread axis for threadably engaging the male threaded element without rotation of either the female threaded element or the male threaded element.

7. The apparatus of claim 1 wherein the female threaded element comprises front end comprising a plurality of threaded spring arms that are biased inwardly towards the thread axis for threadably engaging the male threaded element without rotation of either the female threaded element or the male threaded element.

8. The apparatus of claim 1 wherein the male threaded element further comprises at least one rearwardly disposed thread pitch disposed adjacent to the rear end of the male threaded element, the rearwardly disposed thread pitch having a sharp profile with a full thread depth for securely threadably engaging the female threaded element upon rotation of either the male threaded element or the female threaded element.

9. The apparatus of claim 1 wherein one of the threaded elements is attached to the mounting rack and the other threaded element is mounted onto the front edge of the plug-in assembly.

10. The apparatus of claim 1 wherein the motor is disposed on the rear side of the mounting rack and the threaded element which is connected to the motor passes through an aperture extending from the rear side to the front side of the mounting rack.

11. The apparatus of claim 1 wherein the motor can be controlled by a system which surrounds the mounting rack.

12. The apparatus of claim 1 wherein the motor is reversible for removing the plug-in assembly from the mounting rack.

13. An apparatus for attaching front edge of a plug-in assembly to a front insertion side of a mounting rack, the mounting rack also having an opposing rear side and an aperture extending from the rear side to the front side thereof, the apparatus comprising:
- a male threaded element and a female threaded element, the female threaded element being attached to the mounting rack, the male threaded element being attached to the front edge of the plug-in assembly, the female threaded element being rotationally connected to a motor, the male and female threaded elements having a common thread axis, the female threaded element threadably receiving the male threaded element when the male threaded element is pressed into the female threaded element without rotation of the female threaded element or the male threaded element,
- wherein the male threaded element comprises a front end which extends towards the female threaded element and a rear end mounted to the plug-in assembly, at least one flattened threaded pitch being disposed adjacent to the front end, the flattened threaded pitch being threadably received by the female threaded element without rotation of the female threaded element or the male threaded element upon insertion of front end of the male threaded element into the female threaded element.

14. The apparatus of claim 13 wherein the motor is mounted to the rear side of the mounting rack, the female threaded element being accommodated in the aperture disposed in the mounting rack.

15. The apparatus of claim 13 wherein the female threaded element comprises front end comprising a threaded elastic sleeve for threadably receiving the male threaded element without rotation of the female threaded element.

16. The apparatus of claim 13 wherein the female threaded element comprises front end comprising at least one threaded spring arm that is biased inwardly towards the thread axis for threadably engaging the male threaded element without rotation of the female threaded element.

17. The apparatus of claim 13 wherein the female threaded element comprises front end comprising a plurality of threaded spring arms that are biased inwardly towards the thread axis for threadably engaging the male threaded element without rotation of the female threaded element.

18. The apparatus of claim 13 wherein the male threaded element further comprises at least one rearwardly disposed threaded pitch disposed adjacent to the rear end of the male threaded element, the rearwardly disposed threaded pitch having a sharp profile with a full thread depth for securely threadably engaging the female threaded element upon rotation of the female threaded element after insertion of the male threaded element into the female threaded element.

19. An apparatus for attaching front edge of a plug-in assembly to a front insertion side of a mounting rack, the mounting rack also having an opposing rear side and an aperture extending from the rear side to the front side thereof, the apparatus comprising:
- a male threaded element and a female threaded element, the male threaded element being attached to the mounting rack, the female threaded element being attached to the front edge of the plug-in assembly, the male threaded element being rotationally connected to a motor, the male and female threaded elements having a common thread axis, the female threaded element threadably receiving the male threaded element when the male threaded element is pressed into the female threaded element without rotation of the male threaded element or the female threaded element,
- wherein the male threaded element comprises a front end which extends towards the female threaded element and a rear end mounted to the plug-in assembly, at least one flattened threaded pitch being disposed adjacent to the front end, the flattened threaded pitch being threadably received by the female threaded element without rotation of the female threaded element or the male threaded element upon insertion of front end of the male threaded element into the female threaded element.

20. A method of attaching a front edge of a plug-in assembly to a front insertion side of a mounting rack, the method comprising the following steps:
- inserting a male threaded element attached to the front edge of the plug-in assembly into a female threaded element attached to the front side of the mounting rack, the female threaded element comprising a threaded elastic sleeve for threadably receiving the male threaded element without rotation of the female threaded element or the male threaded element, the female threaded element being connected to a motor for rotation of the female threaded element,
- wherein the male threaded element comprises a front end which extends towards the female threaded element and a rear end mounted to the plug-in assembly, at least one flattened threaded pitch being disposed adjacent to the front end, the flattened threaded pitch being threadably received by the female threaded element without rotation of the female threaded element upon insertion of front end of the male threaded element into the female threaded element.
- activating the motor to rotate the female threaded element to draw the male threaded element into the female threaded element and simultaneously drawing at least one male connector strip mounted onto the front edge of the plug-in assembly into a female connector strip mounted onto the front side of the mounting rack.

21. A method of attaching a front edge of a plug-in assembly to a front insertion side of a mounting rack, the method comprising the following steps:
- inserting a female threaded element attached to the front edge of the plug-in assembly onto a male threaded element, the male threaded element being attached to the front side of the mounting rack, the male threaded element being connected to a motor for rotation of the male threaded element, the female threaded element comprising a threaded elastic sleeve for threadably receiving the male threaded element without rotation of the male threaded element or the female threaded element,
- wherein the male threaded element comprises a front end which extends towards the female threaded element and a rear end mounted to the plug-in assembly, at least one flattened threaded pitch being disposed adjacent to the front end, the flattened threaded pitch being threadably received by the female threaded element without rotation of the female threaded element upon insertion of front end of the male threaded element into the female threaded element,
- activating the motor to rotate the male threaded element to draw the female threaded element onto the male threaded element and simultaneously drawing at least one male connector strip mounted onto the front edge of the plug-in assembly into a female connector strip mounted onto the front side of the mounting rack.

* * * * *